United States Patent
Yamaguchi et al.

(10) Patent No.: US 8,220,147 B2
(45) Date of Patent: Jul. 17, 2012

(54) METAL-CONTAINING RESIN PARTICLE, RESIN PARTICLE, ELECTRONIC CIRCUIT SUBSTRATE, AND METHOD OF PRODUCING ELECTRONIC CIRCUIT

(75) Inventors: Naoko Yamaguchi, Yokohama (JP); Hideo Aoki, Yokohama (JP); Chiaki Takubo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/541,568

(22) Filed: Aug. 14, 2009

(65) Prior Publication Data

US 2010/0000083 A1    Jan. 7, 2010

Related U.S. Application Data (62) Division of application No. 11/017,778, filed on Dec. 22, 2004, now abandoned.

(30) Foreign Application Priority Data

Dec. 26, 2003 (JP) ................ P2003-435758

(51) Int. Cl.
- *H05K 3/02* (2006.01)
- *H05K 3/10* (2006.01)
- *H01K 3/22* (2006.01)
- *H01K 3/00* (2006.01)

(52) U.S. Cl. ................ 29/846; 29/848; 29/849
(58) Field of Classification Search ............ 29/846, 29/848, 849
See application file for complete search history.

(56) References Cited

U.S. PATENT DOCUMENTS

| | | | | |
|---|---|---|---|---|
| 4,404,237 | A | * | 9/1983 | Eichelberger et al. ....... 427/97.5 |
| 4,696,861 | A | * | 9/1987 | Tatematsu et al. ............. 428/328 |
| 4,767,665 | A | * | 8/1988 | Seeger ........................ 428/328 |
| 4,770,963 | A | * | 9/1988 | Pai et al. ...................... 430/64 |
| 4,897,326 | A | * | 1/1990 | Marengo ................... 430/120.2 |
| 5,243,142 | A | * | 9/1993 | Ishikawa et al. ............. 174/262 |
| 6,080,443 | A | * | 6/2000 | Date et al. ................ 427/213.33 |
| 6,157,789 | A | * | 12/2000 | Kamada et al. ................... 399/1 |
| 6,214,508 | B1 | * | 4/2001 | Kamada et al. ............ 430/110.2 |
| 6,426,143 | B1 | * | 7/2002 | Voss et al. .................... 428/378 |
| 6,440,625 | B1 | * | 8/2002 | Berlin ........................... 430/55 |
| 6,528,145 | B1 | * | 3/2003 | Berger et al. ................. 428/156 |
| 6,632,320 | B1 | * | 10/2003 | Takeichi et al. ............... 156/327 |
| 6,673,190 | B2 | * | 1/2004 | Haas et al. .................... 156/289 |

(Continued)

FOREIGN PATENT DOCUMENTS

CN     1261689 A     8/2000

(Continued)

OTHER PUBLICATIONS

Official Action issued by the Japanese Patent Office on Jun. 26, 2007, for Japanese Patent Application No. 2003-435758, and English language translation thereof.

(Continued)

*Primary Examiner* — David Angwin
(74) *Attorney, Agent, or Firm* — Finnegan, Henderson, Farabow, Garrett & Dunner, L.L.P.

(57) ABSTRACT

According to one mode of the present invention, metal-containing resin particles composed of a resin containing 50 wt % or more of a thermosetting resin and having a ratio of weight of absorbed moisture to weight of resin from 500 to 14500 ppm, and fine metal particles contained in said resin, is provided.

7 Claims, 5 Drawing Sheets

U.S. PATENT DOCUMENTS

| | | | |
|---|---|---|---|
| 6,833,180 B1 | 12/2004 | Kodemura | |
| 6,838,164 B2 * | 1/2005 | Yamane et al. | 428/297.4 |
| 6,883,180 B1 * | 4/2005 | Willis | 2/209.13 |
| 6,956,098 B2 * | 10/2005 | Summers et al. | 528/170 |
| 6,977,130 B2 * | 12/2005 | Aoki et al. | 430/120.2 |
| 7,018,705 B2 * | 3/2006 | Nakatani et al. | 428/209 |
| 7,053,494 B2 * | 5/2006 | Seko | 257/784 |
| 7,056,571 B2 * | 6/2006 | Tomekawa et al. | 428/209 |
| 2004/0197487 A1 * | 10/2004 | Aoki et al. | 427/458 |

FOREIGN PATENT DOCUMENTS

| | | |
|---|---|---|
| JP | 63-221350 A | 9/1988 |
| JP | 6-145307 A | 5/1994 |
| JP | 6-250434 A | 9/1994 |
| JP | 07-263841 | 10/1995 |
| JP | 08-056077 | 2/1996 |
| JP | 9-64513 A | 3/1997 |
| JP | 2000-137337 A | 5/2000 |
| JP | 2001-284769 | 10/2001 |
| JP | 2002-229265 A | 8/2002 |

OTHER PUBLICATIONS

Office Action issued by the Japanese Patent Office on Jan. 30, 2007, for Japanese Patent Application No. 2003-435758, and English language translation thereof.

Chinese Office Action, mailed by the Chinese Patent Office on Apr. 21, 2006, for counterpart Chinese Application No. 2004101034374.

Yamaguchi, N. et al., "New Process of Manufacturing Printed Circuit Boards Using Electrophotography Technology," 2004 ICEP Proceedings, pp. 168-172 (Apr. 2004).

Aoki, H. et al., "Wiring Board and Multilayer Wiring Board," U.S. Appl. No. 10/896,054, filed Jul. 22, 2004.

* cited by examiner

METAL-CONTAINING RESIN PARTICLE, RESIN PARTICLE, ELECTRONIC CIRCUIT SUBSTRATE, AND METHOD OF PRODUCING ELECTRONIC CIRCUIT

This is a divisional of U.S. patent application Ser. No. 11/017,778, filed Dec. 22, 2004 now abandoned, the entire contents of which are incorporated herein by reference.

CROSS-REFERENCE TO THE INVENTION

This application is based upon and claims the benefit of priority from the prior Japanese Patent Application No. 2003-435758, filed on Dec. 26, 2003; the entire contents of which are incorporated herein by reference.

BACKGROUND OF THE INVENTION

1. Field of the Invention

The present invention relates to a metal-containing resin particle, a resin particle, an electronic circuit substrate, and a method of producing the electronic circuit.

2. Description of the Related Art

Conventionally, when producing an electronic circuit substrate, a conductor pattern is formed by performing resist coating on a thin metal film, exposure, development, etching, and the like (refer to Japanese Patent Laid-open Application No. Hei 7-263841). However, this method requires exposure masks for respective layers, the design and production thereof require a plenty of time and cost. Besides, when alternation, modification or the like of the exposure masks becomes necessary, a great influence is exerted upon the time of delivery or costs of the electronic circuit substrate.

Because of these disadvantages, a method of forming an electronic circuit substrate by printing using electrophotography is proposed instead of the above method. In this method, an underlying layer for electroless plating having an arbitrary pattern is first prepared by using electrophotography with a metal-containing resin particle. A plating layer is formed on the underlying layer by electroless plating, and an insulating layer is formed by electrophotography using resin particles made of resin only, so that an electronic circuit substrate is formed.

Incidentally, in order to accurately form an underlying layer and an insulating layer by electrophotography, it is necessary to control the amount of electrostatic charge of metal-containing resin particles and resin particles. Here, considering heat resistance, thermosetting resin mainly composed of an epoxy resin is used for both the resin of the metal-containing resin particles and the resin particles containing resin only. However, since epoxy radicals are easy to absorb moisture due to its high hydrophilic nature, there is a problem in that the electrical resistance of the surfaces of the metal-containing resin particles and the resin particles is lowered, and the desired amount of electrostatic charge is difficult to obtain.

BRIEF SUMMARY OF THE INVENTION

According to one mode of the present invention, metal-containing resin particles comprising a resin containing a thermosetting resin at 50 wt % or more and having a rate of moisture absorption from 500 to 14500 ppm, and fine metal particles contained in the resin, is provided.

According to another mode of the present invention, resin particles comprising a resin containing a thermosetting resin at 50 wt % or more and having a rate of moisture absorption of 500 to 14500 ppm, is provided.

According to still another mode of the present invention, an electronic circuit substrate comprising a substrate, a metal-containing resin layer formed on said substrate and formed by using the metal-containing resin particles according to claim 1, and a plating layer formed on said metal-containing resin layer by using metal particles of said metal-containing resin layer as kernels is provided.

According to yet another mode of the present invention, an electronic circuit substrate comprising a substrate, a plating layer formed on said substrate, and a resin layer formed on said plating layer, and formed by using the resin particles according to claim 5 is provided.

According to another mode of the present invention, a method of producing an electronic circuit, comprising forming a metal-containing resin layer in an environment at 70% or less of relative humidity, wherein said forming of the metal-containing resin layer comprises forming a visible image on a surface of a photoconductor on which an electrostatic latent image is formed, by electrostatically attaching metal-containing resin particles composed of a resin containing 50 wt % or more of a thermosetting resin and having a rate of moisture absorption from 500 to 14500 ppm, and fine metal particles contained in the resin, and transferring the visible image composed of the metal-containing resin particles and formed on the surface of the photoconductor on a substrate, is provided.

According to still another mode of the present invention, a method of producing an electronic circuit, comprising forming a metal-containing resin layer in an environment of 70% or less in relative humidity, wherein said forming of the resin layer comprises forming a visible image on a surface of a photoconductor on which an electrostatic latent image is formed, by electrostatically attaching resin particles composed of a resin containing 50 wt % or more of a thermosetting resin and having 500 to 14500 ppm in rate of moisture absorption, and transferring the visible image composed of the resin particles and formed on the surface of the photoconductor on the substrate, is provided.

DETAILED DESCRIPTION OF THE INVENTION

Figure 1:
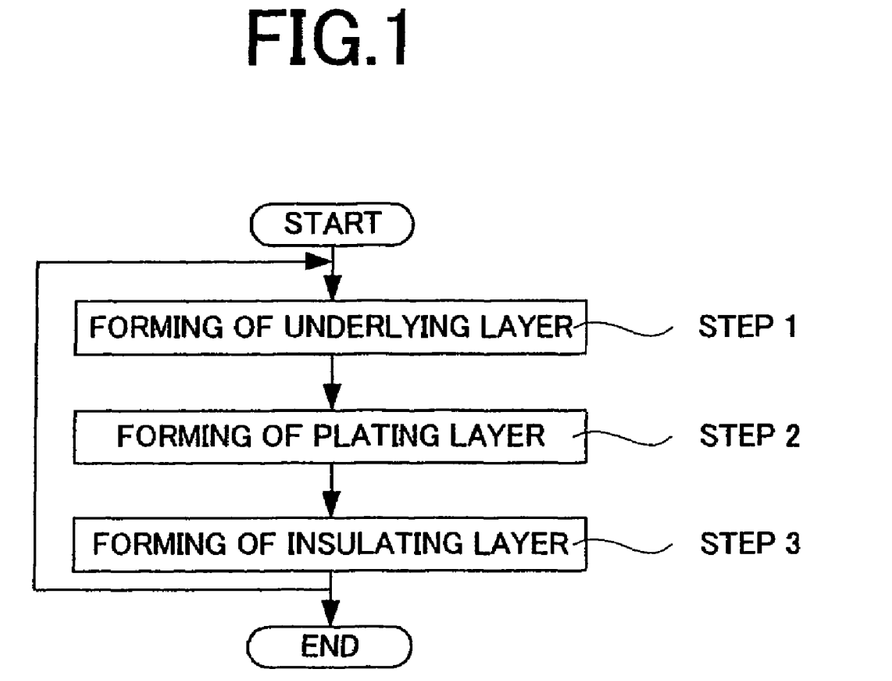
FIG. 1 is a flow chart showing a flow of production process of an electronic circuit substrate relating to an embodiment of the present invention.
Figure 3:
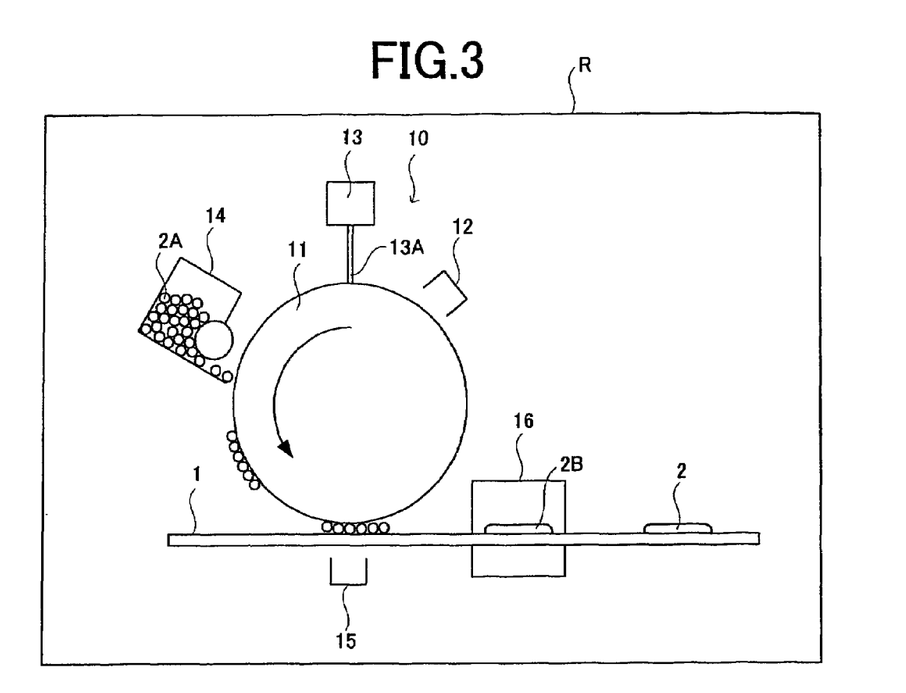
FIG. 3 is a view showing the operation of an underlying layer forming apparatus relating to an embodiment of the present invention.
Figure 4:
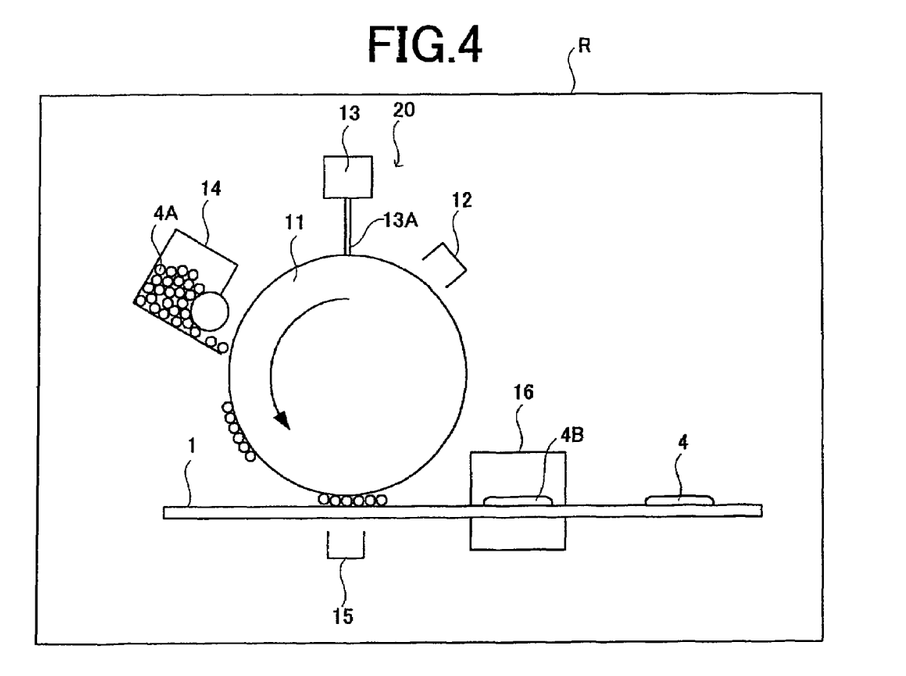
FIG. 4 is a view showing the operation of an insulating layer forming apparatus relating to an embodiment of the present invention.

Hereinafter, embodiments will be explained. FIG. 1 is a flow chart showing a flow of production process of an electronic circuit substrate relating to an embodiment of the present invention, and FIG. 2A to FIG. 2D are schematic process drawings of the electronic circuit substrate relating to an embodiment of the present invention. FIG. 3 is a view showing operations of an underlying layer forming apparatus relating to an embodiment of the present invention, and FIG. 4 is a view showing operations of an insulating layer forming apparatus relating to an embodiment of the present invention.

Figure 2A:
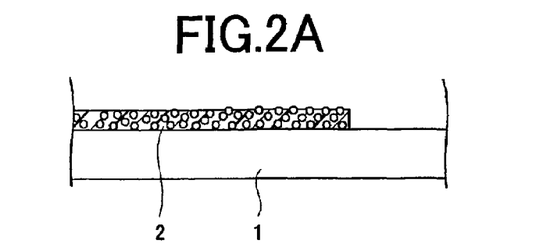
FIG. 2A to FIG. 2D are schematic diagrams of production process of the electronic circuit substrate relating to an embodiment of the present invention.

First, as shown in FIG. 1 and FIG. 2A, an underlying layer 2 for electroless plating is formed by printing using electrophotography (step 1). The underlying layer 2 can be formed by using an underlying layer forming apparatus 10 as shown in FIG. 3. Concretely, the underlying layer forming apparatus 10 mainly comprises a photoconductor drum 11, an electrostatic charger 12, a laser generator and scanner 13, a developing machine 14, a transfer printing machine 15, and a fixing apparatus 16. The underlying layer forming apparatus 10 is placed in a room R where the relative humidity is 70% or lower.

In order to form the underlying layer 2, while the photoconductive drum 11 is turned along the arrow direction first, a surface potential of the photoconductive drum 11 is uniformly charged at a fixed potential (for instance, a minus charge) by the electrostatic charger 12. As a concrete method of charging, a Scorotron method of charging, a roller method of charging, and a brush method of charging can be cited.

Next, a laser beam 13A is irradiated to the photoconductive drum 11 in response to an image signal by a laser generator and scanner 13 removing the minus charge in the irradiated portion to form a charged image (electrostatic latent image) of a prescribed pattern on the surface of the photoconductive drum 11.

Then, charged metal-containing resin particles 2A stored in a developing machine 14 are electrostatically attached on the electrostatic latent image on the photoconductive drum 11 by means of a feeder to obtain a visible image. A dry or wet toner transfer technology in a well known electrophotography type copy system can be applied to the developing machine 14.

When the developing machine is a dry type, the metal-containing resin particles having a particle size from 3 to 50 μm are stored in the developing machine 14. More desirable particle size of the metal-containing resin particles 2A is from 5 to 10 μm. On the other hand, when the developing machine 14 is a wet type, the metal-containing resin particles 2A having a particle size of 3 μm or less are stored in the developing machine 14 together with a liquid which serves as a solvent.

The metal-containing resin particles 2A stored in the developing machine 14 are supplied to the photoconductive drum 11 by means of the feeder to develop. At this time, a charged area development or a discharged area development can be used.

The metal-containing resin particles 2A are composed of a resin containing 50 wt % or more of a thermosetting resin having a rate of moisture absorption from 500 to 14500 ppm and fine metal particles contained in this resin. A rate of moisture absorption of the resin is desirably from 4000 to 8000 ppm. The reason for determining the rate of moisture absorption of the resin to be from 500 to 14500 ppm is as follows. If the rate of moisture absorption of the resin is less than 500 ppm or more than 14500 ppm, the amount of electrostatic charge is below 5 μC/g being a lower limit of the electrostatic charge with which an ordinary dry type copier is able to develop.

A thermosetting resin in a B-stage solid at room temperatures is used as a thermosetting resin to be contained in the resin. The B-stage refers to a state in which at least one portion of the thermosetting resin is not hardened but melted when prescribed heat is applied. As the thermosetting resin in B-stage, epoxy resin, polyimide resin, phenol resin, bismaleimide resin, cyanate ester resin, bismaleimide-triazine resin, benzicyclobutene resin, polyimide resin, polybenzoxazol resin, butadiene resin, silicone resin, polycarbo-di-imide resin, polyurethane resin and so on can be used.

For the fine metal particles, at least one kind of fine metal particles selected from the group consisting of platinum (Pt), palladium (Pd), copper (Cu), gold (Au), nickel (Ni), and silver (Ag) is desirably used. These fine metal particles serve as kernels for electroless plating and have a catalytic function for progress of a plating reaction. Among these metal elements, especially lead or copper is desirably used.

Then, the visible image (pattern) formed with the metal-containing resin particles 2A on the surface of the photoconductive drum 11 is electrostatically transferred onto a desired substrate 1 from the photoconductive drum 11 by the copier 15. The photoconductive drum 11 is recovered after the transfer by removing the metal-containing resin particles 2A left on the surface of the photoconductive drum 11 with a cleaning apparatus (not shown).

Then, the metal-containing resin particles 2A in B-stage, which are transferred onto the substrate 1, are passed through the fixing apparatus 16 which emits heat or light, so that a thermosetting resin composing the metal-containing resin particles 2A is melted to form a metal-containing resin layer 2B. Thereafter, the metal-containing resin layer 2B is heated or irradiated with light by the fixing apparatus 16 to be hardened so that the metal-containing resin layer 2B is fixed on the substrate 1. Through these processes, an underlying layer 2 is formed.

Figure 2B:
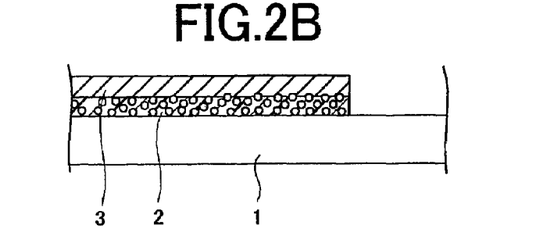

After forming the underlying layer 2 on the substrate 1, a plating layer 3 is formed on the underlying layer 2 by electroless plating using the fine metal particles contained in the underlying layer 2 as kernels as shown in FIG. 2B(step 2). It should be noted that though the plating layer 3 is formed by electroless plating in the present embodiment, the plating layer 3 can be formed by both of electroless plating and electroplating.

In order to effectively perform the electroless plating, it is recommendable to treat at least some of the fine metal particles to project on the surface of the underlying layer 2 before performing the electroless plating to the underlying layer. As such a treatment, for instance, etching with a solvent such as aceton, isopropanol acid or alkali or the like, or shot blasting, airblasting and so on can be cited.

Figure 2C:
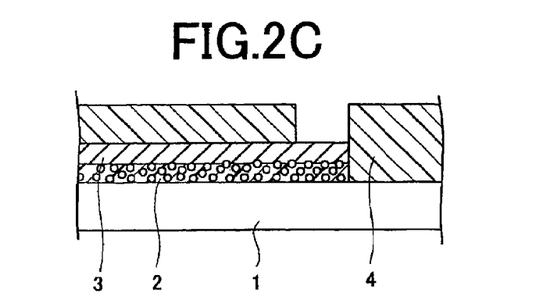

After forming the plating layer 3 on the substrate 1, an electrically insulative insulating layer 4 is formed on the substrate 1 as shown in FIG. 2C by printing using the electrophotography (step 3). The insulating layer 4 can be formed using an insulating layer forming apparatus 20 nearly similar in structure to the underlying layer forming apparatus 10. Here, the insulating layer forming apparatus 20 is placed in the room R having relative humidity of 70% or lower. A resin particle 4A is stored in the developing machine 14 in place of the metal-containing resin particle 2A as shown in FIG. 4.

In order to form the insulating layer 4, first, while a photoconductive drum 11 is turned along the arrow direction, a surface potential of the photoconductive drum 11 is uniformly charged at a fixed potential (for instance, minus charge) by an electrostatic charger 12.

Next, after charging the surface of the photoconductive drum 11, a laser beam 13A is irradiated to the photoconductive drum 11 in response to an image signal by a laser generator 13 removing the minus charge in the irradiated portion to form a charged image (electrostatic latent image) of a prescribed pattern on the surface of the photoconductive drum 11.

After the electrostatic latent image is formed on the surface of the photoconductive drum 11, the resin particles 4A which are charged by the developing machine 14, are electrostatically attached on the surface of the photoconductive drum 11 to form a visible image on the surface of the photoconductive drum 11 (step 33). A dry or wet toner transfer technology in a well-known electrophotography copying system can be applied to the developing machine 14.

When the developing machine 14 is a dry type, the resin particles 4A having an average particle size from 3 to 50 µm are stored in the developing machine 14. The more desirable particle size of the resin particle 4A is from 8 to 15 µm. On the other hand, when it is a wet type, the resin particles having a particle size of 3 µm or less are stored together with a liquid being the solvent in the developing machine 14. When forming the insulating layer 4, it is desirable for the insulation layer to have a thickness to some extent in terms of electric insulation, and therefore, the particle size of the resin particle 4A is desirably larger than that of the metal-containing resin particle 2A.

The resin particles 4A stored in the developing machine 14 are supplied to the photoconductive drum 11 by a feeder to be developed. At this time, a charged area development or a discharged area development can be used.

The resin particles 4A are composed of resin containing 50 wt % or more of a thermosetting resin, having the rate of moisture absorption from 500 to 14500 ppm. The rate of moisture absorption of the resin is desirably from 4000 to 8000 ppm. The reason for determining the rate of moisture absorption of the resin to be from 500 to 14500 ppm is as follows. If the rate of moisture absorption of the resin is less than 500 ppm or more than 14500 ppm, the amount of electrostatic charge comes to be below 5 µC/g being a lower limit of the electrostatic charge with which an ordinary dry type copier is able to develop.

A thermosetting resin in a B-stage solid state at room temperatures can be used as a thermosetting resin to be contained in the resin. As the thermosetting resin in B-stage, epoxy resin, polyimide resin, phenol resin, bismaleimide resin, cyanate ester resin, bismaleimide-triazine resin, benzicyclobutene resin, polyimide resin, polybenzoxazol resin, butadiene resin, silicone resin, polycarbo-di-imide resin, polyurethane resin and so on can be used. It is also recommendable to disperse fine particles of silica or the like contained in the resin particles 4A at a prescribed ratio, thereby enabling to control the characteristics such as stiffness, coefficient of thermal expansion and the like especially in a multilayer wiring substrate, so that improvement in reliability of substrate can be realized.

After the visible image (pattern) is formed on the surface of the photoconductive drum 11, it is electrostatically transferred onto the desired substrate 1 from the photoconductive drum 11 by the copier 15. The photoconductive drum 11 after the transfer is recovered by removing the resin particles 4A left on the surface of the photoconductive drum 11 with a cleaning apparatus (not shown).

After the visible image is transferred onto the substrate 1, the visible image is heated by the fixing apparatus 16 to soften the resin particles 4A composing the visible image so that a resin layer 4B is formed. Then, the resin layer 4B is hardened by heat or light irradiation with the fixing apparatus 16 to fix the resin layer 4B on the substrate 1 (step 35). Through the above process, the insulating layer 4 composed of the resin layer 4B is formed.

Figure 2D:
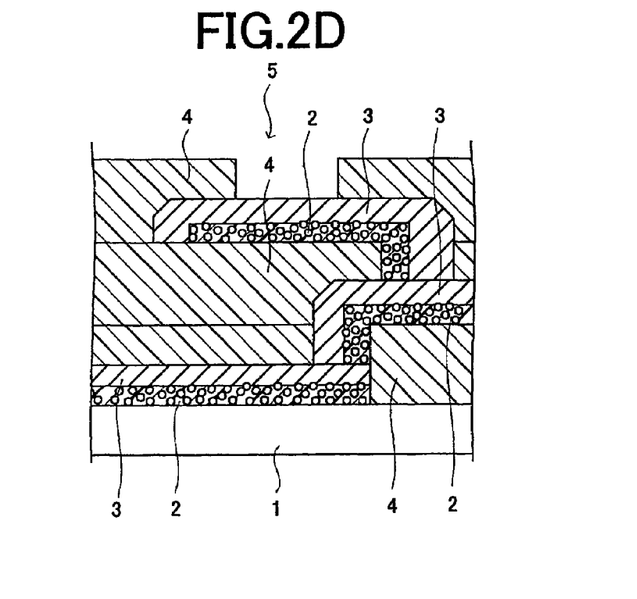

After forming the insulating layer 4 on the substrate 1, the electronic circuit forming process from step 1 to step 3 is repeated to form a multilayered electronic circuit substrate 5 such as shown in FIG. 2D.

Since the metal-containing resin particles 2A composed of a resin containing 50 wt % or more of a thermosetting resin and having the rate of moisture absorption from 500 to 14500 ppm, and fine metal particles contained in this resin, are used in the present embodiment, the amount of charge of the metal-containing resin particles 2A can be controlled in an optimum range, so that the underlying layer 2 (metal-containing resin layer 2B) can be accurately formed.

Since the resin particles 4A composed of a resin containing 50 wt % or more of a thermosetting resin and having the rate of moisture absorption from 500 to 14500 ppm are used in the present embodiment, the amount of charge of the resin particles 4A can be controlled in an optimum range, so that the insulating layer 4 (resin layer 4B) can be accurately formed.

Since the underlying layer 2 is formed in the room R where the relative humidity is 70% or less in the present embodiment, the rate of moisture absorption of the resin in the metal-containing resin particle 2A can be kept at 14500 ppm or less, so that the underlying layer 2 (metal-containing resin layer 2B) can be accurately formed.

Since the insulating layer 4 is formed in the room R where the relative humidity is 70% or less in the present embodiment, the rate of moisture absorption of the resin particle 4A can be kept at 14500 ppm or less, so that the insulating layer 4 (resin layer 4B) can be accurately formed.

EXAMPLE 1

Hereinafter, example 1 will be explained. An optimum range of the rate of moisture absorption in the resin of the metal-containing resin particle is studied in the present example 1.

In the present example, metal-containing resin particles composed of 50 wt % resin and 50 wt % fine metal particles, having an average particle size of 7.9 µm are used. Here, the resin is composed of epoxy resin only and the fine metal particles are composed of copper (Cu). A plurality of metal-containing resin particles different in rate of moisture absorption are prepared and the amount of electrostatic charge at the time when these metal-containing resin particles are charged is measured. Here, the rate of moisture absorption of the resin in the metal-containing resin particles is a value obtained by a calculation in such a manner that the metal-containing resin particle is kept standing still for two days in a vacuum environment while weighing the resin particle. A state at which nearly no change of weight is recognized is taken as a dry state of the resin particle, and the rate of moisture absorption is calculated by dividing a change in weight of the resin since then with the weight of the resin in the dry state.

Figure 5:
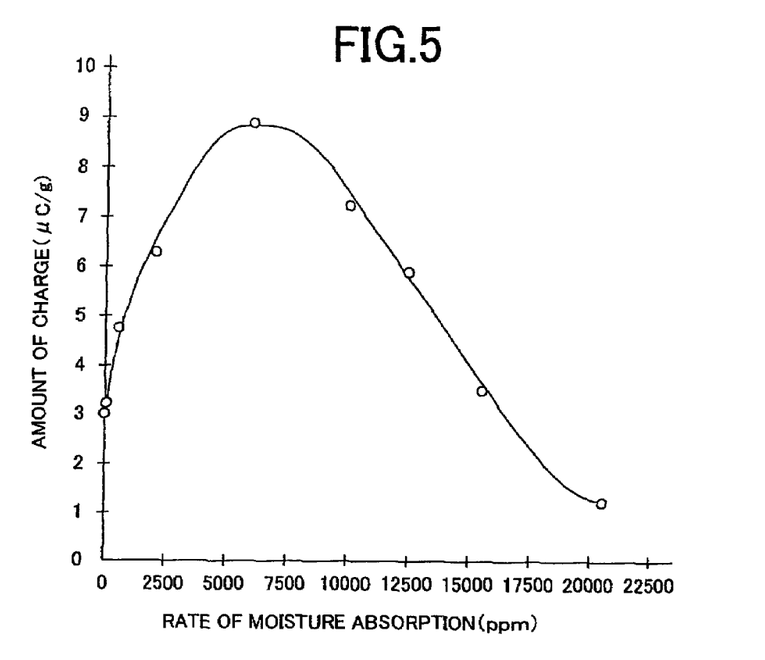
FIG. 5 is a graph showing relations between a rate of moisture absorption of metal-containing resin particles and the amount of electrostatic charge of the metal-containing resin particles relating to example 1.

The result of the study will be described below. FIG. 5 is a graph showing relations between the rate of moisture absorption of the resin in the metal-containing resin particle and the amount of electrostatic charge of the metal-containing resin particle relating to the present example. As shown in FIG. 5, when the rate of moisture absorption is 458 ppm, the amount of the electrostatic charge is 4.76 µC/g. This is due to existence of a metal-containing resin particle which causes reverse charging. On the other hand, when the rate of moisture absorption is 15424 ppm, the amount of charge is 3.52 µC/g. This is because the electrical resistance on the surface of the metal-containing resin particle is lowered, which makes the charging thereon difficult. The amounts of electrostatic charge in either cases are below 5 µC/g, the value being a lower limit of the electrostatic charge with which an ordinary dry type copier is able to develop. When determining the range of rate of moisture absorption to be 5 μC/g or more from this graph, it is found that when the rate of moisture absorption is from 500 ppm to 14500 ppm, the amount of electrostatic charge becomes 5 μ/g or more. From this result, the optimum range in rate of moisture absorption of the resin in the metal-containing resin particle is confirmed to be from 500 ppm to 14500 ppm.

EXAMPLE 2

Hereinafter, example 2 will be explained. In the present example, an optimum range of the rate of moisture absorption in the resin particle is studied.

In the present example, resin particles composed of epoxy resin only, having an average particle size of 7.9 μm are used. A plurality of resin particle samples different in rate of moisture absorption are prepared, and the amount of electrostatic charge at the time when these resin particles are charged is measured. Here, the rate of moisture absorption of the resin is a value obtained by a calculation in such a manner that the resin particle is kept standing still for two days in a vacuum environment while weighing the resin particle. A state at which nearly no change of weight is recognized is taken as a dry state of the resin particle, and the rate of moisture absorption is calculated by dividing a change in weight of the resin since then with the weight of resin particle in the dry state.

Figure 6:
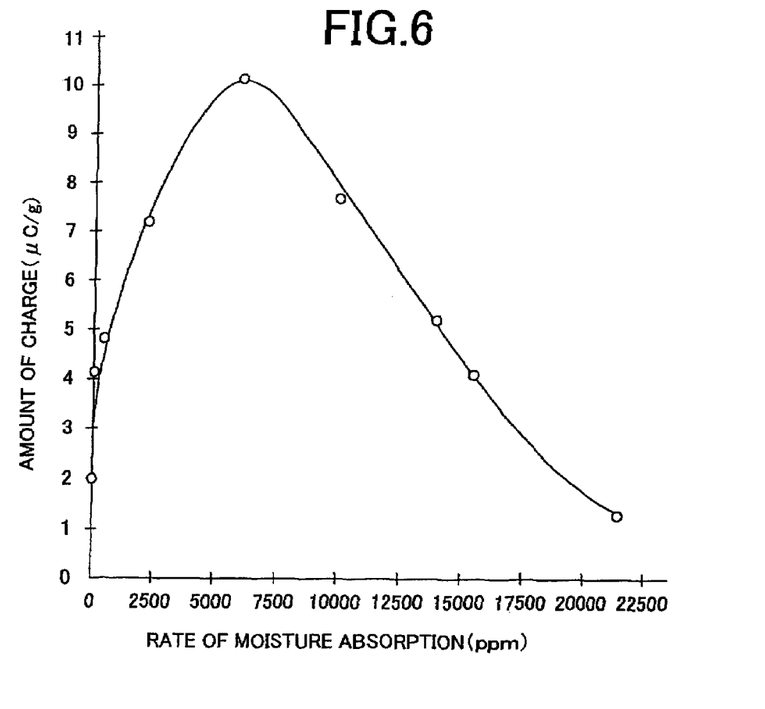
FIG. 6 is a graph showing relations between a rate of moisture absorption of resin particles and the amount of electrostatic charge of the resin particles relating to example 2.

The result of the study will be described below. FIG. 6 is a graph showing relations between the rate of moisture absorption of the resin particle and the amount of electrostatic charge of the resin particle relating to the present example. As shown in FIG. 6, when the rate of moisture absorption is 443 ppm, the amount of the electrostatic charge is 4.82 μC/g. This is due to existence of a resin particle which causes reverse charging. On the other hand, when the rate of moisture absorption is 15320 ppm, the amount of charge is 4.10 μC/g. This is because the electrical resistance on the surface of the resin particle is lowered, which makes the charging thereon difficult. The amounts of electrostatic charge in either cases are below 5 μC/g, the value being a lower limit of the electrostatic charge with which an ordinary dry type copier is able to develop. When determining the range of rate of moisture absorption to be 5 μC/g or more from this graph, it is found that when the rate of moisture absorption is from 500 ppm to 14500 ppm, the amount of electrostatic charge becomes 5 μ/g or more. From this result, the optimum range in rate of moisture absorption of the resin particle is confirmed to be from 500 ppm to 14500 ppm. The reason for that the optimum range in the rate of moisture absorption of the resin of the metal-containing resin particle is the same as that of the resin particle is as follows. Since 89% in volume of the metal-containing resin particle containing 50 wt % of copper (Cu) is resin, the surfaces of both resin are nearly equal, as long as the average particle size of the metal-containing resin particles is the same as that of the resin particles.

EXAMPLE 3

Hereinafter, example 3 will be explained. In the present example, the relative humidity of an environment, at which the rate of moisture absorption of the resin particle is 14500 ppm or less is studied.

In the present example, two kinds of resin particle samples composed of epoxy resin only, having average particle sizes of 8.5 μm and 11.4 μm respectively, are prepared, and the rates of moisture absorption of the resin particles when these resin particles are kept standing still in the environment having relative humidity (R.H.) of 70% and 80% respectively are measured.

Figure 7:
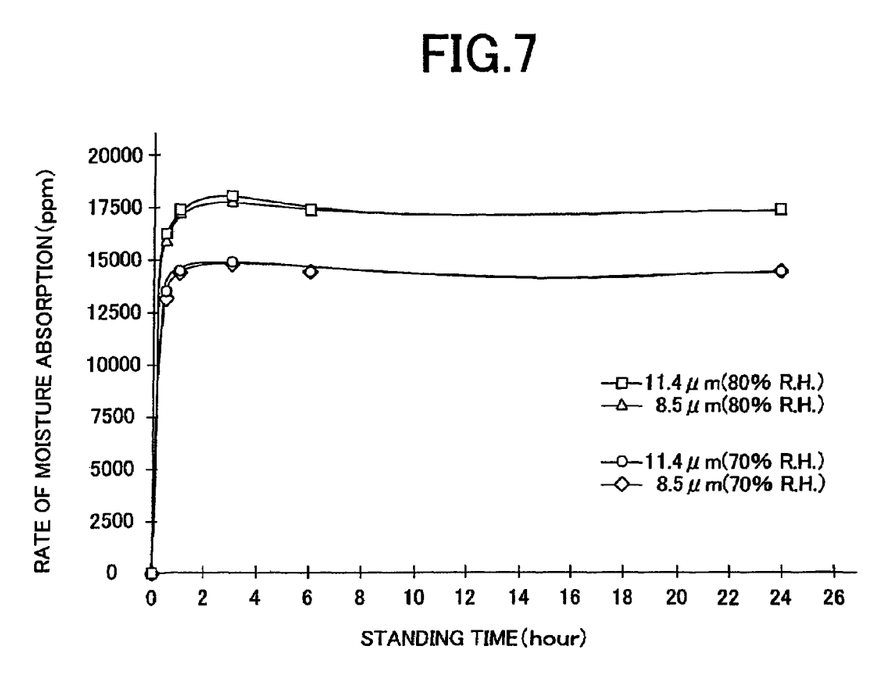
FIG. 7 is a graph showing relations between time for standing still and a rate of moisture absorption of the resin particles relating to example 3.

The result will be described below. FIG. 7 is a graph showing relations between the time for standing still and the rate of moisture absorption of the resin particle relating to the present example. As shown in FIG. 7, it is confirmed that the rate of moisture absorption of the resin particle is nearly saturated for about six hours without depending on the average particle size, and becomes constant thereafter. Also confirmed is that the rate of moisture absorption of the resin particle differs depending on the relative humidity of the environment where the resin particle is kept standing still. More concretely, when the resin particle is kept standing still in an environment at 70% R.H., the rate of moisture absorption becomes constant at around 14400 ppm, and when the resin particle is kept standing still in an environment at 80% R.H., the rate of moisture absorption becomes constant at around 17300 ppm. From this result, it is confirmed that a resin particle having the rate of moisture absorption of 14500 ppm or less can be obtained when the resin particle is kept standing still in an environment at 70% R.H. The smaller the average particle size of the resin particles, the greater the surface area per unit mass becomes. Accordingly, though the resin particles having an average particle size of 8.5 μm have the rate of moisture absorption about 50 ppm larger than the resin particles having an average particle size of 11.4 μm, it is considered that an environmental relative humidity has a larger influence upon the rate of moisture absorption than the average particle size, there is no significant difference within a range of actual average particle sizes of the resin particles.

It should be noted that the present invention is not limited to the content of description in the above-described embodiment, structures, materials, arrangements of respective members, and the like can be appropriately modified within the meaning and range of equivalency of the present invention.

What is claimed is:

1. A method of producing an electronic circuit, comprising:
   forming a metal-containing resin layer completely covered by a plating layer in an environment at 70% or less of relative humidity,
   wherein said forming of the metal-containing resin layer comprises,
   forming a visible image on the surface of a photoconductor on which an electrostatic latent image is formed by electrostatically attaching metal-containing resin particles composed of a resin containing 50 wt % or more of a thermosetting resin and having a ratio of weight of absorbed moisture to weight of resin from 500 to 14500 ppm, and fine metal particles contained in said resin; and
   transferring the visible image composed of said metal-containing resin particles and formed on the surface of said photoconductor onto a substrate.

2. The method of producing an electronic circuit according to claim 1, wherein said resin has the ratio of weight of absorbed moisture to weight of resin from 4000 to 8000 ppm.

3. The method of producing the electronic circuit according to claim 1, wherein said thermosetting resin comprises a B-stage thermosetting resin.

4. The method of producing the electronic circuit according to claim 1, wherein said fine metal particle is at least one kind of the fine metal particles selected from the group consisting of platinum (Pt), palladium (Pd), copper (Cu), gold (Au), nickel (Ni), and silver (Ag).

5. The method of producing the electronic circuit according to claim 1, further comprising;

forming the plating layer on the metal-containing resin layer by using the fine metal particle as a kernel; and forming a resin layer, which is not a metal-containing resin layer, to be performed in an environment at 70% or less of relative humidity, wherein said forming of the resin layer, which is not a metal-containing resin layer, comprises:

forming another visible image on the surface of the photoconductor on which the electrostatic latent image is formed by electrostatically attaching resin particles composed of the resin containing 50 wt % or more of a thermosetting resin and having a ratio of weight of absorbed moisture to weight of resin from 500 to 14500 ppm; and transferring the another visible image composed of the resin particles and formed on the surface of the photoconductor onto the plating layer.

6. The method of producing the electronic circuit according to claim 5, wherein the resin in the resin particle has the ratio of weight of absorbed moisture to weight of resin from 4000 to 8000 ppm.

7. The method of producing the electronic circuit according to claim 5, wherein the thermosetting resin in the resin particle comprises a B-stage thermosetting resin.

* * * * *